United States Patent [19]

Ohashi et al.

[11] Patent Number: 5,200,668
[45] Date of Patent: Apr. 6, 1993

[54] LUMINESCENCE ELEMENT

[75] Inventors: Yutaka Ohashi, Fujisawa; Atsuhiko Nitta; Nobuhiro Fukuda, both of Yokohama; Hiroshi Waki, Mitaka, all of Japan

[73] Assignee: Mitsui Toatsu Chemicals, Inc., Tokyo, Japan

[21] Appl. No.: 536,567
[22] PCT Filed: Nov. 21, 1989
[86] PCT No.: PCT/JP89/01181
§ 371 Date: Jul. 18, 1990
§ 102(e) Date: Jul. 18, 1990
[87] PCT Pub. No.: WO90/05998
PCT Pub. Date: May 31, 1990

[30] Foreign Application Priority Data

Nov. 21, 1988 [JP] Japan ............... 1-292467
Jan. 25, 1989 [JP] Japan ............... 1-13983
Feb. 7, 1989 [JP] Japan ............... 1-26578

[51] Int. Cl.$^5$ ............ H05B 33/12; H05B 33/14; H05B 33/26
[52] U.S. Cl. ............................. 313/498; 313/499; 313/504; 313/506
[58] Field of Search ............... 313/498, 499, 504, 506

[56] References Cited

U.S. PATENT DOCUMENTS 4,539,507  9/1985  VanSlyke et al. ............ 313/504

FOREIGN PATENT DOCUMENTS 1572181  7/1980  United Kingdom .

OTHER PUBLICATIONS

Patent Abstracts of Japan, vol. 14, No. 380 (E-965), (4323) of Aug. 16, 1990.
Patent Abstract of Japan, vol. 14, No. 117 (E898) (4060), of Mar. 5, 1990.
Japanese Abstract 87-076576, date Apr. 1987.

Primary Examiner—Sandra L. O'Shea
Attorney, Agent, or Firm—Fisher, Christen & Sabol

[57] ABSTRACT

This invention relates to an injection type thin film luminescence element having a high luminance and a high stability characterized in having two electrode layers at least one of which is transparent or translucent and having between these two electrode layers a luminescence function-manifesting layer comprising a laminated layer of a p-type or n-type inorganic semiconductor thin film layer and an organic compound thin film layer.

7 Claims, 2 Drawing Sheets

LUMINESCENCE ELEMENT

TECHNICAL FIELD

This invention relates to an electroluminescence (EL) element by which electroluminescence is carried out.

BACKGROUND TECHNIQUE

EL elements are generally classified into intrinsic EL elements and injection EL elements. Among them according to the operation mechanism of an injection type EL element forward bias is impressed on the p-n junction of an diode or the like, electrons and positive holes are injected into the the junction from electrodes of the both sides respectively, and light is emitted by their recombination. Generally, this EL element is a luminescence element which has a structure wherein a layer manifesting the above luminescence function is arranged between two electrodes, and by the impression of voltage between these electodes converts electric energy directly to light. Characteristics of this element lie in that the element is capable of operating in a wide driving frequency range from direct current to alternative current and moreover being drived in a low voltage, and further has a possibility of a good conversion efficiency from electricity to light and the like and a possibility that, unlike usual luminescence elements such as incandescent lamps and fluorescent lamps, there can be realized face-shaped emitters, for example, thin film panels; display members, for example, of lines, drawings, images or the like having various shapes such as belt shape a cylindrical shape; panels having a large area; etc.

As materials for these injection EL elements, there have hitherto been used mainly inorganic semiconductor materials such as GaP. On the other hand, there has recently been reported an injection luminescence diode element wherein an organic compound thin film having a positive hole conductivity and an organic compound thin film having an electron conductivity are superposed into two layers [C. W. Tang: Appl. Phys. Lett. 51. (12). 913, (1987)].

Luminescence elements in which the organic material is used are drawing attention since they have characteristics, for example, that various thin film-forming methods can be selected and it is possible to form thin films of a large area in a good accuracy.

However, when an element is formed only using organic materials for EL known at present, there arise problems, for example, that the intensity of luminescence is limited in some extent and luminous intensity is unstable, and thus it is the present state of things that such an element does not come to be put to practical use. Thus, EL elements are now strongly desired about which it is possible to prepare uniform thin films having a large area and which are fertile in mass productivity and advantageous in cost face.

As a result of vigorous investigations, the present inventors have created an EL element which solves the above problems, and is fertile in mass productivity and advantageous in cost face and about which it is possible to prepare uniform thin films having a large area.

That is, the present inventors have paid their attention to the facts that the injection amount of a carrier has relation to mobility of the carrier and the mobility is higher in an organic substance than in an inorganic substance, and that a semiconductor type inorganic material has conveniences, for example, that by modulating its composition energy levels of the valence band and conduction band can be changed and controlled; have found that the above problems are solved by adopting a device constitution wherein a specific inorganic substance and a specific organic substance are joined; and have completed this invention. Such a combination of an inorganic substance and an organic substance has hitherto not been known at all. In the usual techniques, there have been used only intimate combinations of an organic substance with an organic substance, or an inorganic substance with an inorganic substance. In this point, this invention is utterly different from the usual ones in technical idea.

Figure 1:
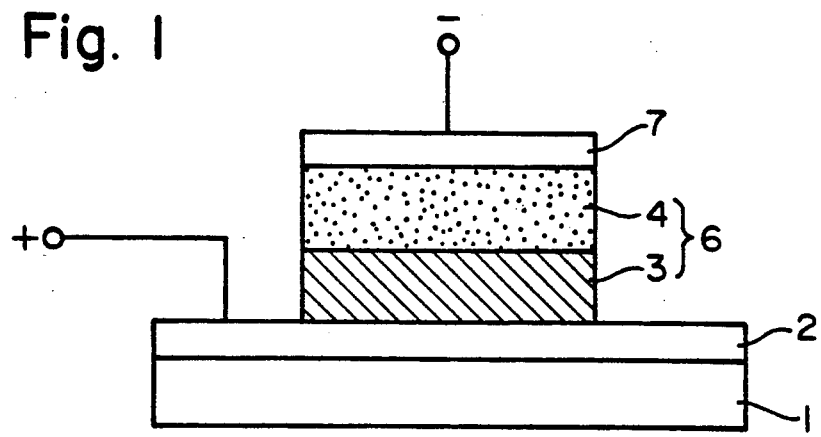
FIG. 1, FIG. 2 and FIG. 3 are typical drawings illustrating constitution of respectively different embodiments of luminescence elements of this invention.

In the drawings, numbers have the following meanings, respectively:

| | |
|---|---|
| 1, 10 and 100 | substrate |
| 2, 20 and 200 | first electrode layer |
| 21, 22, 210 and 220 | layer constituting the first electrode layer |
| 3, 30 and 300 | inorganic semiconductor thin film layer |
| 4, 40, 400 and 500 | organic thin film layer |
| 6, 60, and 600 | luminescence function-manifesting layer |
| 7, 70 and 700 | second electrode layer |

DISCLOSURE OF THE INVENTION

According to this invention, a luminescence element is provided which comprises two electrode layers at least one of which is transparent or translucent and a luminescence function-manifesting layer provided between these two electrode layers, the luminescence function-manifesting layer comprising an inorganic semiconductor thin film layer and an organic semiconductor thin film layer.

FIG. 1 represents a fundamental embodiment of practice of one of them. This luminescence element contains two electrode layers 2 and 7, at least one of which is transparent or translucent, and has between these two electrode layers a luminescence function-manifesting layer 6 composed of a laminated layer of an inorganic semiconductor thin film layer 3 and an organic compound thin film layer 4. In FIG. 1, the electrode layer 2 in contact with the inorgamic semiconductor thin film layer 3 is referred to as the first electrode layer, and the electrode layer 7 in contact with the organic compound thin film layer 4 referred to as the second electrode layer. The number 1 is a suitable substrate. As substrates, transparent ones are preferred, and examples thereof include plates of glass, quartz, alumina, sapphire, calcium fluoride and the like. If at least the second electrode layer is transparent among the two electrodes, it is also possible to use as substrates opaque ones such as strainless steel sheets and ceramic plates.

The inorganic semiconductor thin film layer is composed of one kind of an inorganic semiconductor thin film or a laminated film of two or more kinds of inorganic semiconductor thin films.

As the inorganic semiconductor thin film there can be used an amorphous thin film, microcrystalline thin film, polycrystalline thin film, monocrystalline thin film or thin film wherein an amorphous substance and microcrystals are mixed, or a laminate of these thin films, or super lattice thin film, or the like. Examples of inorganic semiconductor materials include single-element semiconductors such as carbon C, germanium Ge, silicon Si and tin Sn; two-element IV—IV group semiconductors such as SiC and SiGe; III-V group semiconductors such as AlSb, BN, BP, GaN, GaSb, GaAs, GaP, InSb, InAs and InP; II-VI group semiconductor materials such as CdS, CdSe, CdTe, ZnO and ZnS; poly-element compound semiconductor materials; and the like. Particularly preferred are those of silicon series, and examples thereof include amorphous Si, hydrogenated amorphous Si, microcrystalline Si, polycrystalline Si, monocrystalline Si, amorphous $Si_{1-x}C_x$, hydrogenated amorphous $Si_{1-x}C_x$(a—SiC:H), microcrystalline $Si_{1-x}C_x$(μc—SiC), monocrystalline $Si_{1-x}C_x$, amorphous $Si_{1-x}N_x$, hydrogenated amorphous $Si_{1-x}N_x$, microcrystalline $Si_{1-x}N_x$, monocrystalline $Si_{1-x}N_x$, etc.

As the above inorganic semiconductor thin film layers, those having a p-type or n-type property are preferred. The thin film itself may have a p-type or n-type property, or it is also possible to use a thin film converted to p-type or n-type by doping with addition of an impurity giving electroconductivity. Thickness of the inorganic semiconductor thin film layer is not particularly limited, but usually preferably on the order of 10 to 3,000 Å. It is of course possible to use those having a thickness other than the above.

As methods of forming the above inorganic semiconductor thin films, there can be used various physical or chemical thin film-forming methods such as photo CVD methods, plasma CVD methods, heat CVD methods, molecular beam epitaxy (MBE), organic metal decomposition methods (MOCVD), vapor deposition methods and sputter methods.

The organic compound thin film layer is composed of one kind of an organic compound thin film or a laminated film of two or more kinds of organic compound thin layers.

As such organic compounds, there can for example be used suitably organic compounds which have a high luminescence quantum efficiency and π electron system susceptible to external perturbation and are liable to be easily excited.

As such organic compounds, there can for example be used condensed polycyclic aromatic hydrocarbons; rubrene; p-terphenyl; 2,5-diphenyloxazole; 1,4-bis-(2-methylstyryl)benzene; xanthine; coumarin; acridine; cyanine dyes; benzophenone; phthalocyanine; and metal complex compounds formed by metal and an organic substance ligand; and compounds forming a complex in an excited state among compounds heterocyclic compounds other than the above and their derivatives, aromatic amines, aromatic polyamines, and compounds having a quinone structure forming a complex in an excited state; polyacetylene; polysilane; and the like; and mixtures of these compounds.

As an example, metal complex compounds formed by a metal and an organic substance ligand are more specifically explained. As complex-forming metals Al, Ga, Ir, Zn, Cd, Mg, Pb, Ta, etc. are suitably used, and as organic substance ligands are used porphyrin, chlorophyll, 8-hydroxyquinoline [oxine (Ox)], phthalocyanine, salicylaldehyde oxime, 1-nitroso-2-naphthol, cupferron (Nitroso phenyl hydroxylamine Ammonium Salt) dithizone, acetylacetone, etc.

More specifically, as oxine complexes there can be mentioned oxine complexes, 5,7-dibromooxine complexes (hereinafter represented by diBrOx), 5,7-diiodooxine complexes (hereinafter represented by diIOx), thiooxine complexes (hereinafter represented by ThiooOx), selenooxine complexes (hereinafter represented by SeIOx), methyloxine complexes (hereinafter represented by MeOx), etc.

Specific examples of preferred metal complex compounds include $Al(Ox)_3$, $Zn(Ox)_2$, $Zn(diBrOx)_2$, $Zn(diIOx)_2$, $Zn(ThiooOx)_2$, $Zn(SeIOx)_2$, $Bi(MeOx)_2$, etc.

Used as organic compound thin films are amorphous thin films, microcrystalline thin films, amorphous thin films containing microcrystals, polycrystalline thin films, and monocrystalline thin films. Thickness of the organic compound thin film is not particularly limited, but usually on the order of 10 to 5,000 Å. It is of course possible to use thickness other than this range.

As methods of formation of the above organic, compound thin films, there can be used various physical or chemical thin film forming methods such as a vacuum vapor deposition method, and further sublimation methods, coating methods (for example, dipping, spin coating, etc.) and the like are also effective.

Figure 2:
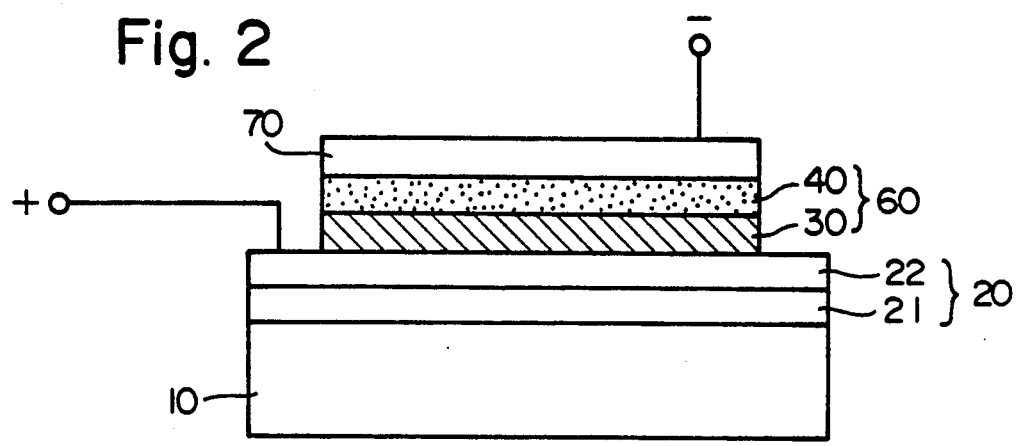

One example of specific layer constitution in case where a p-type inorganic semiconductor thin film layer is used is shown in FIG. 2.

The luminescence element of FIG. 2 is a thin film type luminescence element, i.e. thin film type EL element characterized in that it has two electrode layers 20 and 70 at least one of which is transparent or translucent and that between these two electrode layers is provided a luminescence function-manifesting layer 60 composed of a laminated layer of a p-type inorganic semiconductor thin film layer 30 and an organic compound thin film layer 40. In FIG. 2, the electrode layer 20 in contact with the inorganic semiconductor thin film layer 30 is referred to as first electrode layer, and the electrode layer 70 in contact with the organic compound thin film layer 40 referred to as second electrode layer. Further, the number 10 is a suitable substrate similar to the number 1 in FIG. 1.

As the first electrode layer 20 and second electrode layer 70, there can be used a thin film of a metal, alloy, metal oxide, metal silicide or the like, or a laminated thin layer of one or two or more kinds of them. More preferably, there can be used materials having a good efficiency of injection of electrons or positive holes into the thin film in contact with the electrode layers.

Hereinafter, as an example, an element is further specifically described which is formed by superposing on a transparent or translucent substrate 10 a transparent or translucent first electrode layer 20, a p-type a-SiC:H thin film layer 30 as a p-type inorganic semiconductor thin film layer, a metal complex thin film layer of an organic compound 40 as an organic compound thin film layer, and a second electrode layer 70 in this order.

The transparent or translucent first electrode layer 20 which comes into contact with the p-type a-SiC:H semiconductor thin film 30 is formed by an electrode material having a good positive hole injection efficiency into the p-type a-SiC:H semiconductor thin film. Used generally as this electrode material is a thin film of a metal, alloy or metal oxide or the like having a large work function of electron ($>4$ eV), or a laminated thin film of them, or the like. Preferred ones of the electrode material include thin films of metal oxides such as tin oxide (SnO$_2$), indium oxide and indium tin oxide (ITO) or their laminted films (for example, ITO/SnO$_2$), and it is also preferred to use thin films of metals such as Pt, Au, Se, Pd, Ni, W, Ta and Te or alloys or their laminated films, thin films of metal compounds such as CuI or their laminated films, and the like. In FIG. 2, the first electrode layer 20 is shown as a laminated film of the electrode layer 21 and the electrode layer 22. For example, the electrode layer 21 is an ITO film and the electrode layer 22 is a SnO$_2$ film.

On the other hand, as the second electrode layer 70 in contact with the metal complex thin film, a metal or alloy thin film or their laminated thin film or the like having a small work function of electron ($<4$ eV) is generally used in order to inject electrons into the metal complex thin film. Preferred ones of the electrode layer material include thin films of metals such as Mg, Li, Na, K, Ca, Rb, Sr, Ce and In; thin films of alloys such as Mg-Ag; thin films of alkali metal compounds such as Cs-O-Ag, Cs$_3$Sb, Na$_2$KSb and (Cs)Na$_2$KSb; their laminated thin films; and the like. Thickness of the electrode layer is not particularly limited, but usually on the order of 100 to 10,000 Å.

As for this EL element, not only those having the above constitutions but also those having other constitutions are useful. For example, the EL element can be one formed by superposing on a opaque substrate a first electrode layer, a p-type a-SiC:H thin film layer, a metal complex thin film layer and a transparent or translucent second electrode layer in this order. In case of such an element, luminescence is perceived through the transparent second electrode layer. Further, it is also possible to take out luminescence through the electrodes of both sides by constituting the substrate, first electrode layer and second electrode layer each using a transparent or translucent substance.

Further, it is also possible to alter the order of formation. In this case, an EL element is formed by superposing on a substrate a second electrode layer, a metal complex thin film layer, a p-type a-SiC:H thin film layer and a first electrode layer in this order. Further, it is also possible to use EL elements in a structure wherein the EL elements are superposed so as to give a multilayer form, i.e. an electrode layer/a luminescence function-manifesting layer/an electrode layer/a luminescence function-manifesting layer/an electrode layer/a luminescence function-manifesting layer/an electrode layer ..... By such a multilayer element structure, the adjustment of tone, multiple coloring and the like become possible. Further, it is also possible to arrange a large number of these EL elements on a plane. It is possible to use the EL elements arranged on the plane as a color display member by changing luminescence color of each EL element.

On the other hand, for a n-type inorganic semiconductor thin film layer, it is preferred to form a two-layer organic compound thin film layer.

Figure 3:
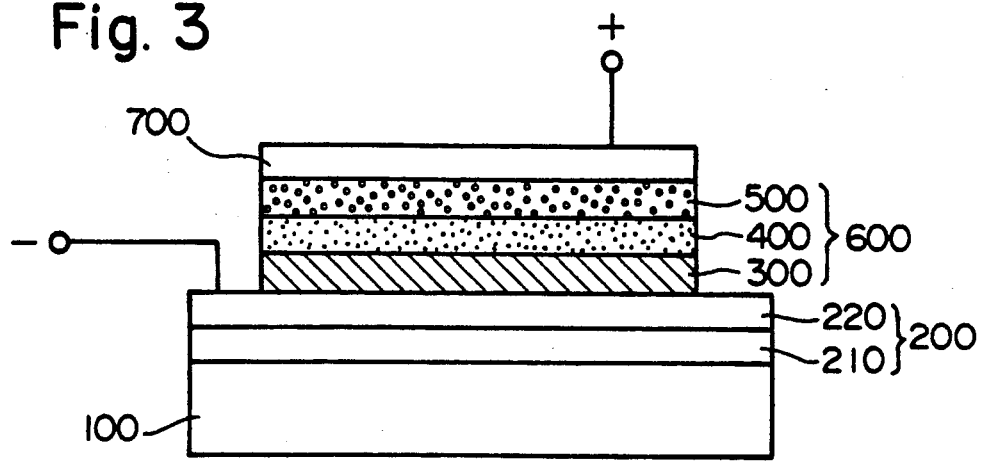

FIG. 3 shows a luminescence element wherein such a n-type thin film is used. This luminescence element is a thin film type luminescence element, namely thin film type EL element characterized in that two electrode layers 200 and 700 at least one of which is transparent or translucent are provided, and that between these two electrode layers is provided a luminescence function-manifesting layer 600 comprising a laminated layer of a n-type inorganic semiconductor thin film layer 300, a first organic compound thin film layer 400 and a second organic compound thin film layer 500.

It is preferred that the organic compound thin film layer composed of the two layers 400 and 500 is a laminate of a layer 400 made of an organic compound which has a high luminescence quantum efficiency and a electron system susceptible to external perturbation and is liable to be easily excited and a layer 500 made of a substance having a large positive hole mobility. More preferably, the organic compound thin film layer is composed of substances transparent to visible radiation.

There can be used as the organic compound thin film layer 400 the same one as the organic compound thin film layer 40 mentioned above in respect of FIG. 2.

The organic compound thin film layer 500 composed of a substance having a large positive hole mobility is formed on the side of the second electrode layer 700. These are, generally, organic compounds containing nitrogen atom(s), a sulfur atom and a phenyl group, and preferred are materials having a drift mobility of $10^{-6}$cm$^2$/V/S or more, under the electric field of at least 10 kV/cm. For example, phenylthiophene, phenylpyrrole, et. are mentioned.

The organic compound thin film can be any of an amorphous thin film, a microcrystalline thin film, an amorphous thin film, an amorphous thin film containing microcrystals, a polycrystalline thin film and a monocrystalline thin film. Thickness of the thin film is not particularly limited, but it is usually suitable that both thickness of the first thin film 400 and that of the second thin film 500 are in the range of 5 to 3,000 Å and the thickness in total is 10 to 5,000 Å.

There can be used as the first electrode layer 200 and the second electrode layer 700 thin film of metals, alloys, metal oxides, metal silicides or the like, or laminated thin films of one or two or more kinds of them, as in the case of the already mentioned. More preferably used are materials having a good efficiency of injection of electrons or positive holes into the thin film in contact with the electrodes.

As an example, an element is further specifically described below which is formed by superposing on a transparent or translucent substrate 100 a transparent or translucent first electrode layer 200, an n-type a-Si:H thin film layer 300 as an inorganic semiconductor thin film layer, a metal complex thin film layer 400 as an organic compound thin film layer, a layer for positive hole transportation 500 and a second electrode layer 700 in this order.

The first electrode layer 200, which is in contact with the n-Si:H semiconductor thin film 300 and transparent or translucent, is formed from an electrode material having a good efficiency of injection of electrons into the n-type a-Si:H semiconductor thin film. This electrode layer is formed from an electrode material which does not form Schottky barrier against the n-type a-Si:H semiconductor thin film, or forms only a small Schottky barrier, if formed. The second electrode layer 700 in contact with the organic compound thin film plays a role of injecting positive holes into the organic compound thin film, and thus thin films of metals or alloys having a large work function of electron or their laminated thin films are generally used therefor.

As for this EL element, not only those having the above constitutions but also those having other constitutions are useful. For example, the EL element can be one formed by superposing on a opaque substrate a first electrode layer, a n-type a-Si:H thin film layer, an organic compound thin film layer and a transparent or translucent second electrode layer in this order. In case of such an element, luminescence is perceived through the transparent second electrode layer. Further, it is also possible to take out luminescence through the electrodes of both sides by constituting the substrate, first electrode layer and second electrode layer each using a transparent or translucent substance.

Further, it is also possible to alter the order of formation. In this case, an EL element is formed by superposing on a substrate a second electrode layer, a metal complex thin film layer, a n-type a-Si:H thin film layer and a first electrode layer in this order. Further, it is also possible to use EL elements in a structure wherein the EL elements are superposed so as to give a multilayer form, i.e. an electrode layer/a luminescence function-manifesting layer/an electrode layer/a luminescence function-manifesting layer/an electrode layer/a luminescence function-manifesting layer/an electrode layer .... By such a multilayer element structure, the adjustment of tone, multiple coloring and the like become possible. Further, it is also possible to arrange a large number of these EL elements on a plane. It is possible to use the EL elements arranged on the plane as a color display member by changing luminescence color of each EL element.

In addition to glass, polymer sheets (self-supporting films) can be used as transparent substrates. Although it is not necessary to limit polymer sheets particularly so long as they have a good transparency, those having heat resistance under the condition of electrode formation are preferred. Examples of utilizable polymers include polyethylene terephthalates (PET), polycarbonates (PC), polyethersulfones (PES), polyetheretherketones (PEEK), etc., but polyethylenes (PE), polypropylenes (PP), etc. are also exemplified. Of course, various copolymers as well as homopolymers can be utilized.

When a polymer sheet is used as a substrate, it is preferred to form a transparent electroconductive film by providing an electrode layer thereon and then constitute a luminescence element in the same manner as the above using this. By use of such a transparent electroconductive film, it becomes possible to prepare an element having flexibility and it becomes easy to enlarge the area and secure mass productivity thereof.

Exemplified as such transparent electroconductive films are those wherein an oxidation film containing indium as a main component and tin and antimony of the order of 2 to 25 atomic based on the indium as a transparent electroconductive film is formed on a polymer sheet; those wherein a laminated film composed of a composite oxide layer containing indium as a main component and tin or tin and antimony, and a layer of a metal such as gold, silver or palladium or an alloy of them is formed as a transparent electroconductive film on a polymer sheet; etc.

BEST MODE FOR CARRYING OUT THE INVENTION

Example 1

A transparent electroconductive film (TCO), i.e. first electrode layer 20 was formed on a glass substrate 10 by piling thereon an ITO film 21 to a film thickness of 800 Å and further piling thereon an $SnO_2$ film 22 to a film thickness of 200 Å. On this transparent electroconductive film was formed a p-type inorganic semiconductor thin film layer 30 by piling according to the photo (CVD) method a p-type hydrogenated amorphous silicon carbide film (p-type a-SiC:H) having a film thickness of 50 Å, and further piling on this thin film according to the plasma CVD method a p-type hydrogenated amorphous silicon carbide film (p-type a-SiC:H) having a film thickness of 100 Å. Then, an organic compound thin film layer 40 was formed on this layer by further piling thereon according to the vacuum resistance heating vapor deposition method a thin film of an aluminum oxine [Al(Ox)$_3$] to a film thickness of 400 Å. Thus, a luminescence function-manifesting layer 60 was formed composed of two layers of the p-type a-SiC:H thin film and the aluminum oxine thin film. Then, a second electrode layer 70 was formed on this layer 60 by piling a Mg metal thin film by the electron beam vapor deposition method. Thus, a luminescence element of this invention as shown in FIG. 2 was obtained. The area of the vapor deposition film of Mg metal was 3 mm square.

Figure 4:
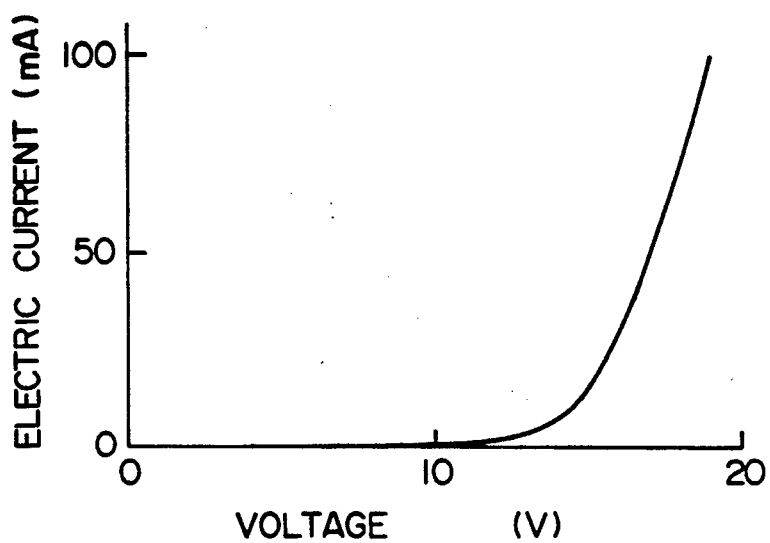
FIG. 4, FIG. 5 and FIG. 6 are graphs illustrating electric characteristics of luminescence elements of this invention, respectively.

Direct voltage was applied on this luminescence element and electric current characteristics were investigated against the applied voltage, and the results were shown in FIG. 4.

When voltage was impressed so as to become plus on the side of the first electrode layer and become minus on the side of the second electrode layer (Mg), electric current increased in proportion to increase of the voltage, as shown in FIG. 4. However, when voltage was impressed so that the polarity becomes reverse, electricity did not pass. In other words, so-called diode characteristic was exhibited. Further, when 18 V of voltage was impressed in the forward direction of this diode, an injection current of 100 mA was observed. This electric current value corresponds to 1 A/cm$^2$ in terms of current density. Further, this element operated both in direct current and in alternative current. Further, under an ordinary indoor fluorescent lamp, bright and distinct green face luminescence was observed. Further, it was ascertained that when luminescence operation was repeated, the lowering of luminescence intensity was not observed, and element characteristics of high performance were exhibited.

Comparative example 1

An element was prepared in the same manner as in Example 1 except that it was formed according to the order of the glass plate/the electrode layer of TCO thin film/the organic compound thin film layer of Al(Ox)$_3$ thin layer/the electrode layer of Mg metal thin film. This element corresponds to the above element from which only the p-type a-SiC:H layer was removed. In case of this element, luminescence was not observed by the naked eye under a usual fluorescent lamp.

Comparative example 2

An element was prepared, as a comparative example, in the same manner as in Example 1 except that it was formed according to the order of the glass plate/the electrode layer of TCO thin film/the organic thin layer/the organic compound thin film layer of Al(Ox)$_3$ thin film/the electrode layer of Mg metal thin film. This element corresponds to an element wherein an organic thin film conducting positive holes is used in place of the p-type a-SiC:H layer. As this organic thin film was used one wherein a diamine series derivation compound was processed into thin film by vacuum vapor deposition. In case of this element, both injection current and luminescence intensity were lower than those of the above element by one to two figures. Further, when luminescence was continuously carried out, the lowering of luminescence intensity was observed.

From the above results, it is seen that desired performances cannot be obtained if, as a luminescence function-manifesting layer, one having a two-layer structure composed of an inorganic semiconductor thin film layer and an organic compound thin film layer, as in the case of this invention, is not used.

Example 2

A transparent first electrode layer 20 was formed on a glass substrate 10 by piling thereon an ITO film 21 to a film thickness of 800 Å and further piling thereon an $SnO_2$ film 22 to a film thickness of 200 Å. A p-type inorganic semiconductor thin film layer 30 was formed on this first electrode by piling according to the photo CVD method a p-type hydrogenated amorphous silicon carbide film (p-type a-SiC:H) having a film thickness of 50 Å, and further piling on this thin film according to the plasma CVD method a p-type hydrogenated amorphous silicon carbide film (p-type a-SiC:H) having a film thickness of 100 Å. Then, an organic compound thin film layer 40 was formed on this layer by further piling thereon according to the vacuum resistance heating vapor deposition method a thin film of rubrene (5,6,11,12-tetraphenylnaphthacene) to a film thickness of 400 Å. Thus, a luminescence function-manifesting layer 60 was formed composed of two layers of the p-type a-SiC:H thin film and the rubrene thin film. Then, a second electrode layer 70 was formed on this layer 60 by piling a Mg metal thin film by the electron beam vapor deposition method. Thus, an EL element of this invention as shown in FIG. 2 was obtained. The area of the vapor deposition film of $\mu g$ was 3 mm squared.

Figure 5:
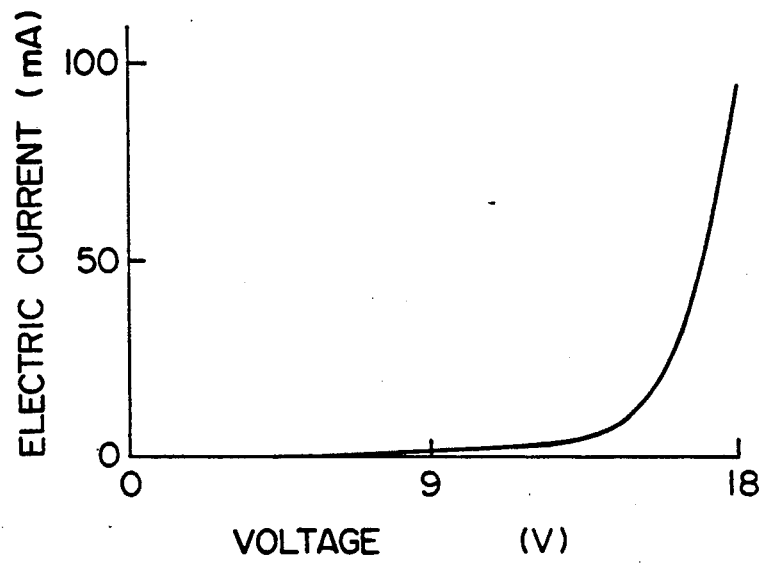

Direct voltage was impressed on this EL element and electric current characteristics were investigated against the impressed voltage, and the results were shown in FIG. 5.

When voltage was impressed so as to become plus on the side of the first electrode layer and become minus on the side of the second electrode layer (Mg), electric current increased in proportion to increase of the voltage, as shown in FIG. 5. However, when voltage was applied so that the polarity becomes reverse, electricity did not pass. In other words, so-called diode characteristic was exhibited. Further, when 18 V of voltage was applied in the forward direction of this diode, an injection current of 100 mA was observed. This electric current value corresponds to 1.1 $A/cm^2$ in terms of current density. The luminescence reached 3,000 $cd/m^2$, and bright and distinct orangish red-colored face luminescence was observed under an ordinary indoor fluorescent lamp. Further, this element operated both in direct current and in alternative current. Further, under a luminous luminance of 100 $cd/m^2$, stable luminescence was observed even in 1,000 times repeated luminescence operations, and thus excellency in durability was ascertained.

Comparative example 3

For comparison, an element was prepared having the same constitution as that of the element in Example 2 except that the p-type a-SiC:H layer was omitted. Voltage was impressed on this element in the forward direction, but bright orangish red-colored luminescence, which was observed in Example 2, was not observed under a 30 W-indoor fluorescent lamp.

Comparative example 4

An EL element was formed using as a positive hole electroconductive thin film a thin film of a diamine series derivative by vacuum vapor deposition in place of the p-type inorganic semiconductor thin film in Example 2. Namely, this is an EL element composed of the glass substrate/the first electrode/the diamine series derivative organic thin film/rubrene/the second electrode. In case of this element, both injection current and luminescence intensity were lower than those of the above element by one to two figures. Further, in continuous luminescence operation, the lowering of luminescence intensity was observed.

From the results of Example 2 and Comparative examples 3 and 4, it was revealed that a luminescence function-manifesting layer of this invention composed of a laminated structure of an inorganic semiconductor thin film layer and an organic compound thin film layer is extremely effective for the enhancement of luminous luminance of EL elements and the improvement of durability of luminescence thereof.

Example 3

A transparent first electrode layer 200 was formed on a glass substrate 100 by piling an ITO film 210 to a film thickness of 800 Å and then further piling thereon a $SnO_2$ film 220 to a film thickness of 200 Å. On this first electrode was piled a n-type hydrogenated amorphous silicon film 300 (n-type a-Si:H) by the plasma CVD method, and on this layer was further piled, first, according to the vacuum resistance heating vapor deposition method an aluminum oxine complex [Al(Ox)$_3$] thin film as a first organic compound thin film layer 400 to a film thickness of 400 Å, and then thereon was piled as a second organic compound thin film layer 500 a positive hole moving layer having a tetraphenylthiophene skeleton to a thickness of 400 Å. Thus, a luminescence function-manifesting layer 600 was formed composed of the n-type a-Si:H thin film 300 and two layers of the organic compound thin film layers 400 and 500. Then a second electrode layer 700 was formed on this layer 600 by piling thereon a gold thin film according to the resistance heating vapor deposition method. Thus, an EL element of this invention as shown in FIG. 3 was obtained. The area of the vapor deposition film of gold is 3 mm square.

Figure 6:
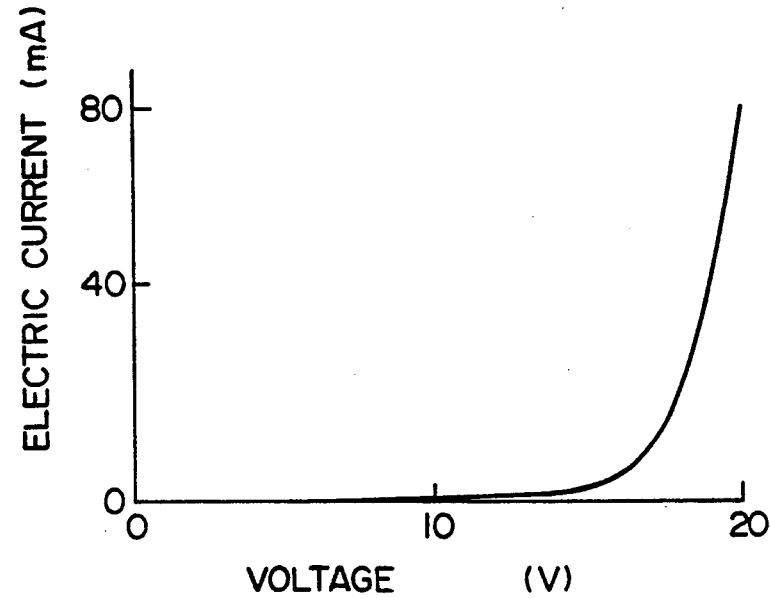

Direct voltage was applied on this EL element and current characteristics against the impressed voltage were investigated, and the results were shown in FIG. 6.

When voltage was applied so as to become plus on the second electrode layer (gold) side and so as to become minus on the first electrode layer side, electric current increased in proportion to the increase of voltage, as shown in FIG. 6, whereas when voltage was applied so that polarity became reverse compared to the above case, electricity did not pass. That is, so-called diode characteristic was exhibited. Further, when 20 V of voltage was impressed in the forward direction of this diode, and injection current of 80 mA was observed. This electric current value corresponds to 0.9 $A/cm^2$ in terms of current density. The luminance reached 1,500 $cd/cm^2$, and bright and distinct green-colored face luminescence was observed under an ordinary indoor fluorescent lamp. Further, this element operated both in direct current and in alternative current. further, under a luminous luminance of 100 cd/m², stable luminescence was observed even in 1,000 times repeated luminescence operations, and thus excellency in durability was revealed.

Comparative example 5

For comparison, an element was prepared having the same constitution as that of the element in Example 3 except that the n-type a-Si:H layer was omitted. Voltage was impressed on this element in the forward direction, but bright green-colored luminescence, which was observed in Example 3, was not observed under a 30 W-indoor fluorescent lamp.

From the results of Example 3 and Comparative example 5, it was revealed that a luminescence function-manifesting layer of this invention composed of an inorganic semiconductor thin film layer and an organic compound thin film layer is exceedingly effective for the enhancement of luminous luminance of EL elements and the improvement of durability of luminescence thereof.

Industrial Applicability

According to this invention was completed an EL element having a sufficient luminous luminance and a stability of the luminous luminance by forming, in an injection EL element which operates by injecting electrons from the one electrode and positive holes from the other electrode, a luminescence function-manifesting layer composed of a two-layer structure of an inorganic semiconductor thin film layer and an organic compound thin film layer between the electrodes.

As is apparent from the examples, such injection luminescence elements of this invention are luminescence elements having high performances which could have not possibly been attained by usual techniques, and industrially extremely useful as thin film light sources, display members or the like.

We claim:

1. A luminescence element which comprises two electrode layers at least one of which is transparent or translucent and a luminescence function-manifesting layer provided between these two electrode layers, the luminescence function-manifesting layer comprising an inorganic semiconductor thin film layer and an organic semiconductor thin film layer.

2. The luminescence element of claim 1 wherein said inorganic semiconductor thin film layer is a p-type inorganic semiconductor thin film layer.

3. The luminescence element of claim 2 wherein said inorganic semiconductor thin film layer is an amorphous silicon semiconductor thin film.

4. The luminescence element of claim 1 wherein said inorganic semiconductor thin film layer is a n-type inorganic semiconductor thin film layer.

5. The luminescence element of claim 4 wherein said n-type inorganic semiconductor thin film layer is an amorphous silicon semiconductor thin film.

6. The luminescence element of claim 4 wherein said organic compound thin film layer is one wherein two layered compound thin films are laminated.

7. The luminescence element of claim 6 wherein said two-layer organic compound thin film layer comprises an organic compound layer readily liable to be excited and an organic compound layer having a large positive hole mobility.

* * * * *